(12) United States Patent  
Khouri et al.

(10) Patent No.: US 7,342,171 B2
(45) Date of Patent: Mar. 11, 2008

(54) INTEGRATED PHOTOVOLTAIC ROOFING COMPONENT AND PANEL

(75) Inventors: Bruce M. Khouri, Glendale, CA (US); Edward J. Stevenson, Malibu, CA (US)

(73) Assignee: Solar Intergrated Technologies, Inc., Los Angeles, CA (US)

( * ) Notice: Subject to any disclaimer, the term of this patent is extended or adjusted under 35 U.S.C. 154(b) by 537 days.

(21) Appl. No.: 10/351,299

(22) Filed: Jan. 23, 2003

(65) Prior Publication Data

US 2004/0144043 A1    Jul. 29, 2004

(51) Int. Cl.
*H01L 31/045* (2006.01)
(52) U.S. Cl. .................... 136/245; 52/173.3
(58) Field of Classification Search ............... 136/245; 52/173.3
See application file for complete search history.

(56) References Cited

U.S. PATENT DOCUMENTS

| | | | |
|---|---|---|---|
| 4,189,881 A | 2/1980 | Hawley | |
| 4,193,820 A | 3/1980 | Thomas | |
| 4,334,120 A | 6/1982 | Yamano et al. | |
| 4,433,200 A | 2/1984 | Jester et al. | |
| 4,485,264 A | 11/1984 | Izu et al. | |
| 4,537,838 A | 8/1985 | Jetter et al. | |
| 4,574,160 A * | 3/1986 | Cull et al. ................ | 136/245 |
| 4,636,577 A | 1/1987 | Peterpaul | |
| 4,636,578 A | 1/1987 | Feinberg | |
| 4,636,579 A | 1/1987 | Hanak et al. | |
| 4,674,244 A | 6/1987 | Francovitch | |
| 4,860,509 A * | 8/1989 | Laaly et al. ................ | 52/173.3 |
| 4,886,554 A | 12/1989 | Woodring et al. | |

(Continued)

FOREIGN PATENT DOCUMENTS

DE        298 24 045 U1    5/2000

(Continued)

OTHER PUBLICATIONS

Search Report for International PCT Application No. PCT/US04/01881, dated Oct. 25, 2004.

(Continued)

*Primary Examiner*—Nam Nguyen
*Assistant Examiner*—Anthony Fick
(74) *Attorney, Agent, or Firm*—Christie, Parker & Hale, LLP.

(57) ABSTRACT

A combination roofing panel and solar module includes a flexible membrane sheet, such as a single-ply membrane sheet, and a plurality of elongated solar or photovoltaic modules arranged side-by-side, end-to-end, or adjacent each other. The modules are adhered to the flexible membrane, and the edges of the modules having electrical connectors or electrodes are arranged to face each other or be aligned with each other. The electrical connectors are connected by a solder connection to module electrodes through apertures in a bottom surface of the flexible membrane and are connected in series. The series electrical connectors are connected directly to direct current (DC) electric devices, to a combiner box, to another panel or to an inverter which coverts direct current (DC) to alternating current electricity for use in residential, commercial or industrial building structures. The ends and elongated edges of a roofing component or panel having the flexible membrane and modules can be sealed for protection.

38 Claims, 14 Drawing Sheets

U.S. PATENT DOCUMENTS

| | | | |
|---|---|---|---|
| 5,092,939 | A | 3/1992 | Nath et al. |
| 5,164,020 | A | 11/1992 | Wagner et al. |
| 5,232,518 | A | 8/1993 | Nath et al. |
| 5,316,592 | A | 5/1994 | Dinwoodie |
| 5,437,735 | A | 8/1995 | Younan et al. |
| 5,482,569 | A | 1/1996 | Ihara et al. |
| 5,505,788 | A | 4/1996 | Dinwoodie |
| 5,575,861 | A | 11/1996 | Younan et al. |
| 5,590,495 | A * | 1/1997 | Bressler et al. ............ 52/173.3 |
| 5,746,839 | A | 5/1998 | Dinwoodie |
| 5,830,779 | A | 11/1998 | Bressler et al. |
| 5,968,287 | A | 10/1999 | Nath |
| 5,998,729 | A | 12/1999 | Shiomi et al. |
| 6,061,978 | A | 5/2000 | Dinwoodie et al. |
| 6,111,189 | A | 8/2000 | Garvison et al. |
| 6,117,703 | A | 9/2000 | Penndorf |
| 6,148,570 | A | 11/2000 | Dinwoodie et al. |
| 6,182,403 | B1 | 2/2001 | Mimura et al. |
| 6,201,180 | B1 * | 3/2001 | Meyer et al. ............... 136/244 |
| 6,245,987 | B1 | 6/2001 | Shiomi et al. |
| 6,268,559 | B1 | 7/2001 | Yamawaki |
| 6,295,818 | B1 | 10/2001 | Ansley et al. |
| 6,380,477 | B1 | 4/2002 | Curtin |
| 6,384,314 | B1 | 5/2002 | Lund-Hansen |
| 6,421,966 | B1 | 7/2002 | Braunstein et al. |
| 6,462,265 | B1 | 10/2002 | Sasaoka et al. |
| 6,465,724 | B1 | 10/2002 | Garvison et al. |
| 6,495,750 | B1 | 12/2002 | Dinwoodie |
| 6,501,013 | B1 | 12/2002 | Dinwoodie |
| 6,534,703 | B2 | 3/2003 | Dinwoodie |
| 6,553,729 | B1 | 4/2003 | Nath et al. |
| 6,570,084 | B2 | 5/2003 | Dinwoodie |
| 6,617,507 | B2 | 9/2003 | Mapes et al. |
| 6,670,541 | B2 | 12/2003 | Nagao et al. |
| 6,729,081 | B2 | 5/2004 | Nath et al. |
| 2001/0045228 | A1 | 11/2001 | Takada et al. |
| 2002/0043031 | A1 | 4/2002 | Eguchi et al. |
| 2002/0046764 | A1 | 4/2002 | Ansley et al. |
| 2002/0078991 | A1 | 6/2002 | Nagao et al. |
| 2002/0129849 | A1 | 9/2002 | Heckeroth |
| 2003/0070368 | A1 | 4/2003 | Shingleton |
| 2003/0094193 | A1 | 5/2003 | Mapes et al. |
| 2003/0116185 | A1 | 6/2003 | Oswald |

FOREIGN PATENT DOCUMENTS

| | | |
|---|---|---|
| GB | 2 296 263 A | 6/1996 |
| JP | 10-102687 | 4/1998 |
| JP | 11-22127 | 1/1999 |
| WO | WO 84/00253 | 1/1984 |

OTHER PUBLICATIONS

European Search Report for Application No. EP 04 70 4476 dated Jul. 11, 2007 (3 pages).

Patent Abstracts of Japan, Publication No. 10102687, Apr. 21, 1998 (1 page).

Patent Abstracts of Japan, Publication No. 11022127, Jan. 26, 1999 (1 page).

Brochure entitled: *Alwitra Flachdach-Systeme*, Evalon-Solar. Published by Alwitra Flachdach-Systeme GmbH & Co. Jun. 1999, 8 pages.

Brochure entitled: *Alwitra The Ultimate Flat-Roofing System*, Evalon-Solar, Published by Alwitra Flachdach-Systeme GmbH & Co., Sep. 1999, 8 pages (English translation of Cite No. 2 above).

Brochure entitled: *Alwitra The Ultimate Flat-Roofing System*, Evalon-Solar, Published by Alwitra Flachdach-Systeme GmbH & Co., Feb. 2002, 8 pages.

Pearson, Andy; *Power Pack*, Building magazine, p. 62, Mar. 2000, 1 page.

Newsletter entitled: *It's Not Called The Ultimate Single Ply Roofing System for Nothing!*, The Ultimate, Published by I.C.B. (International Construction Board) Limited, Issue 12, 2002, 2 pages.

\* cited by examiner

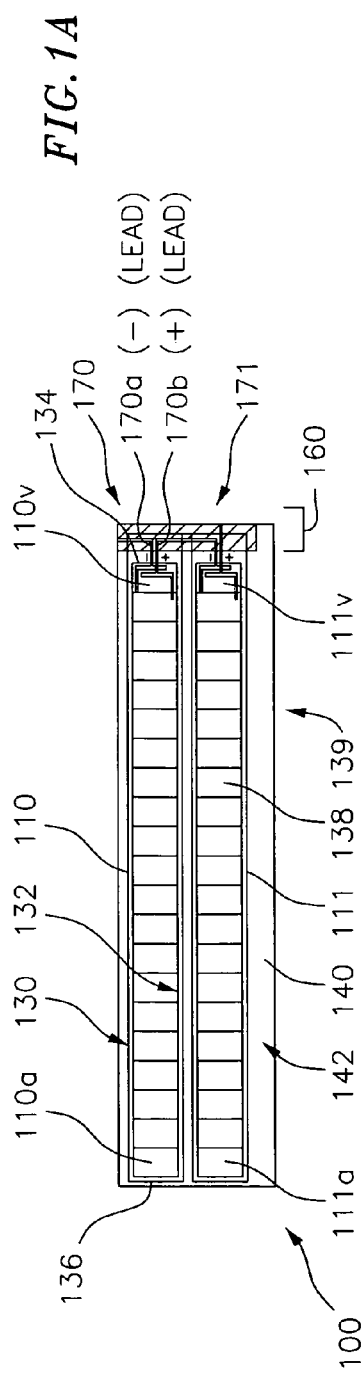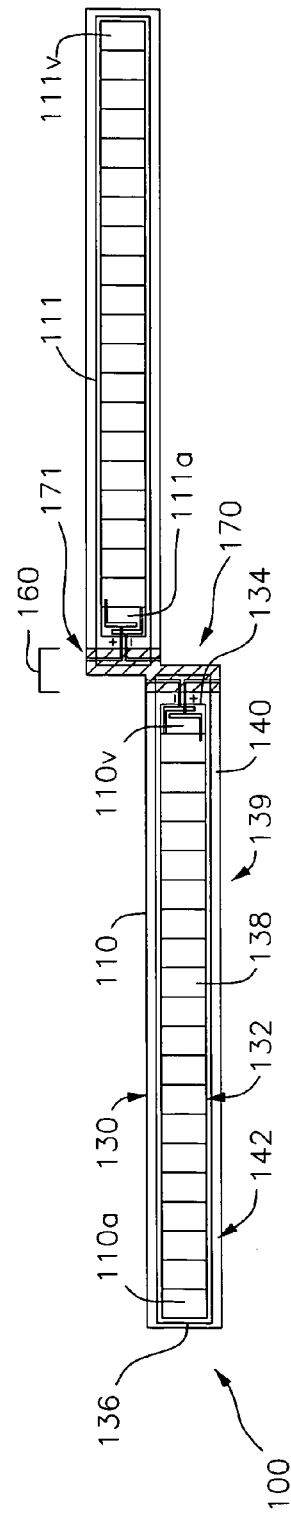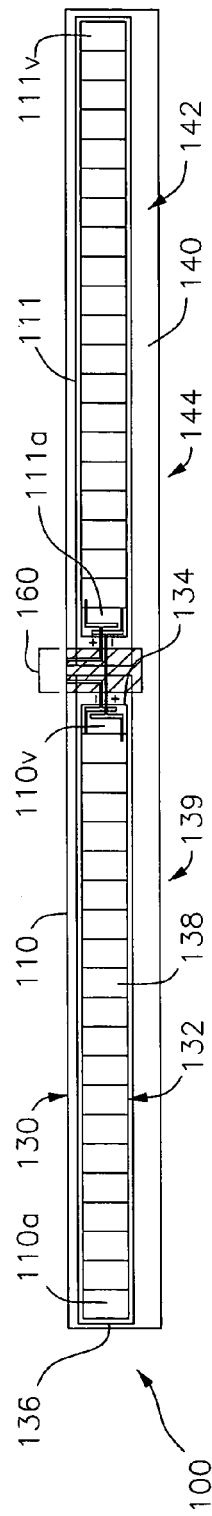

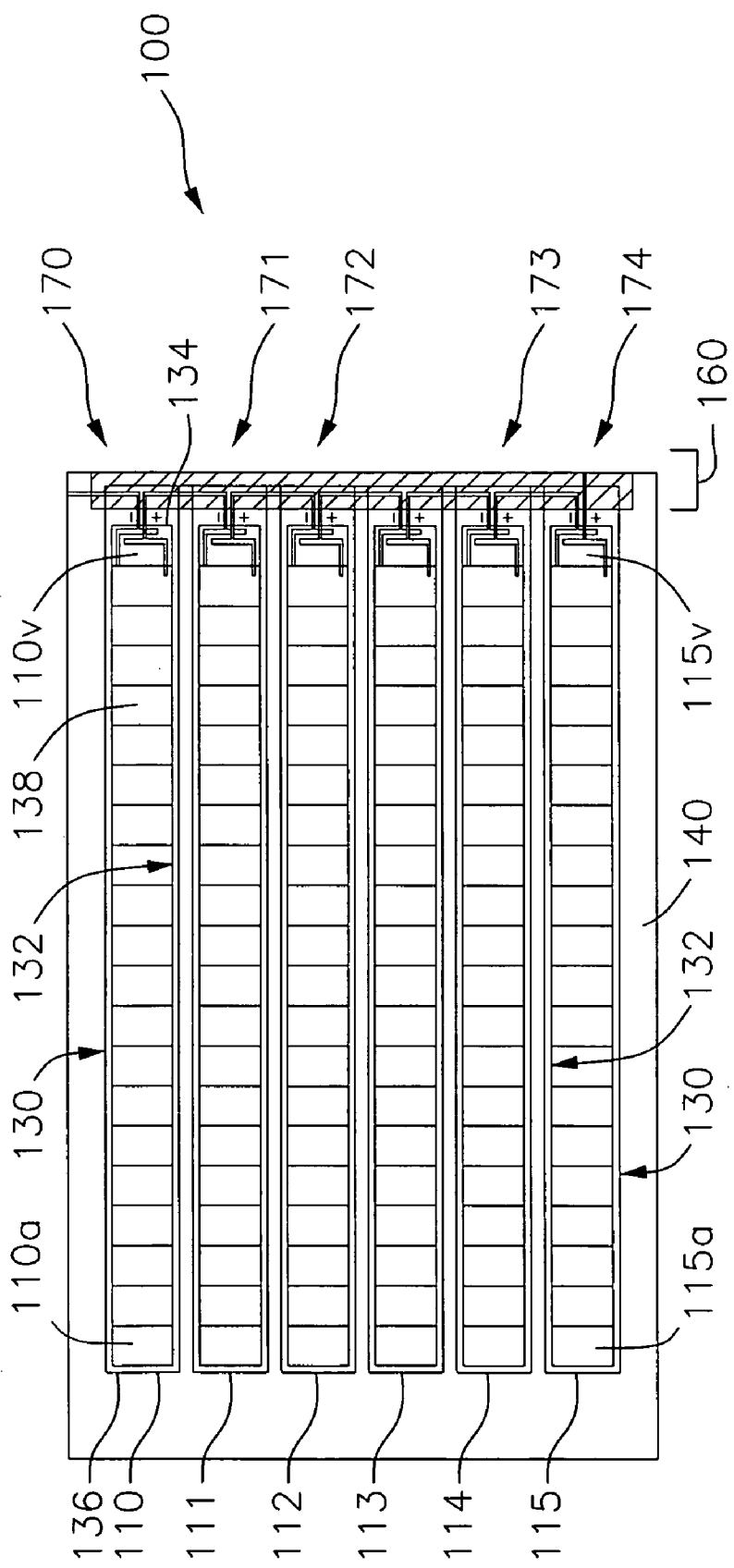

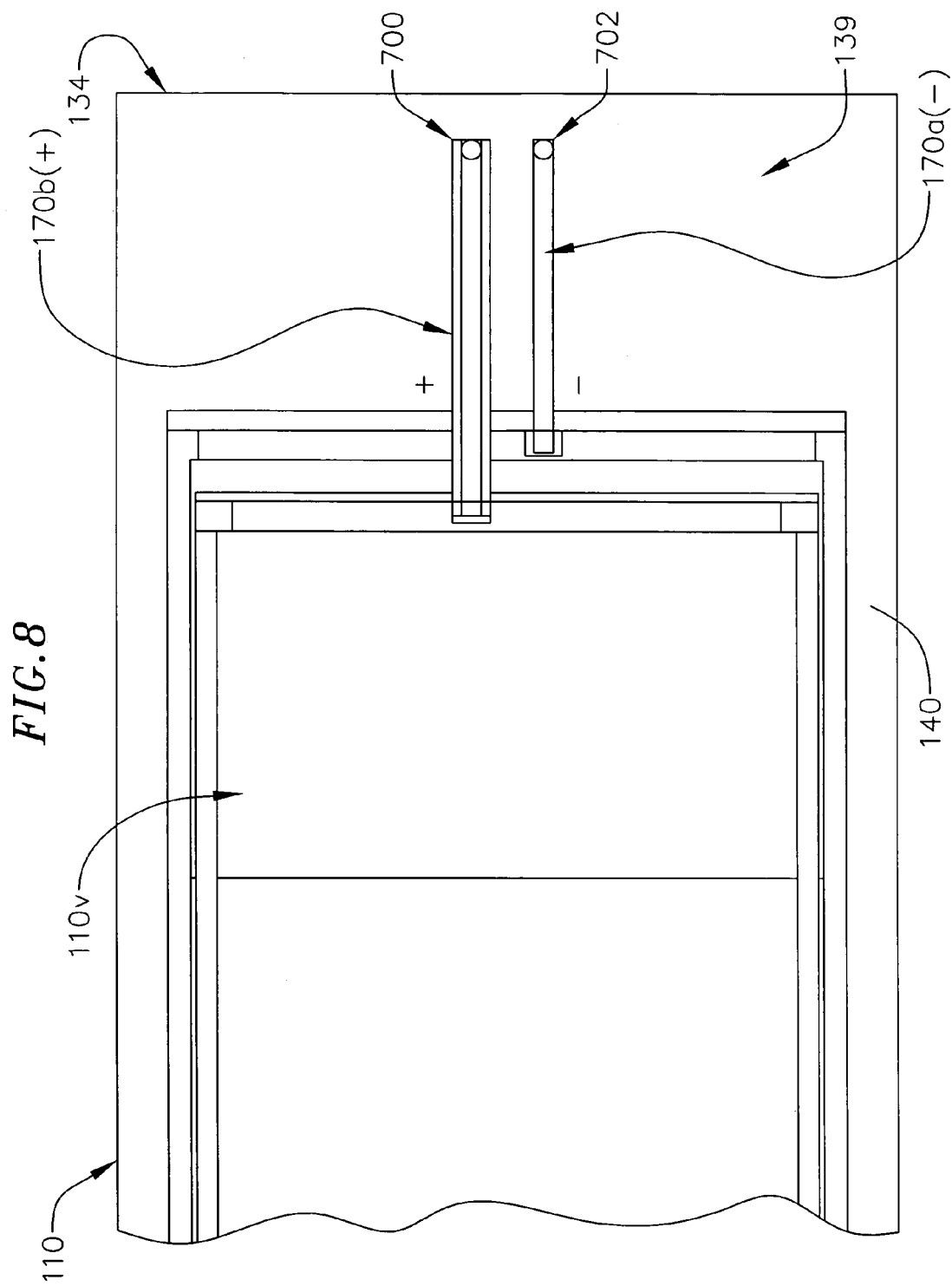

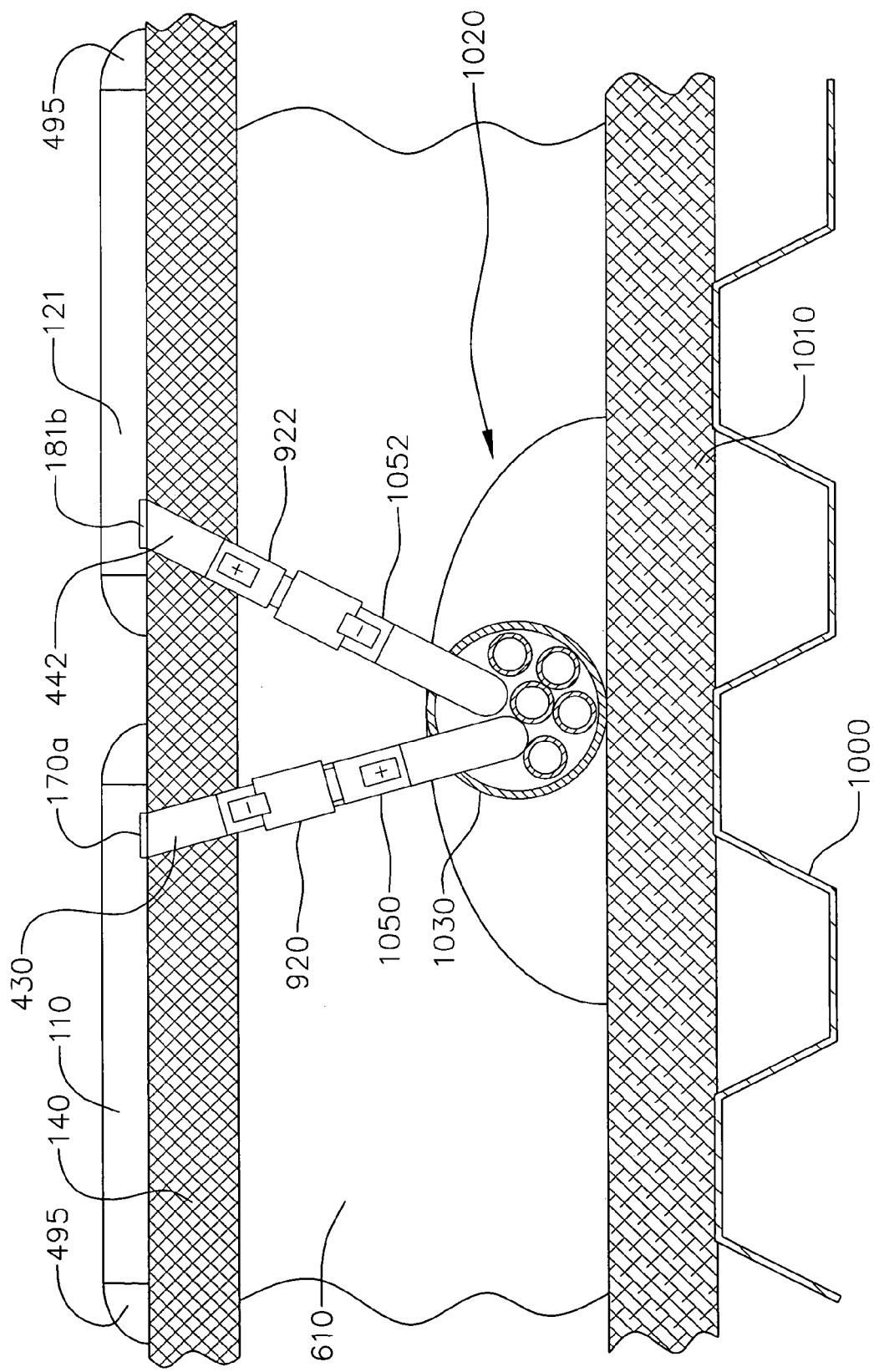

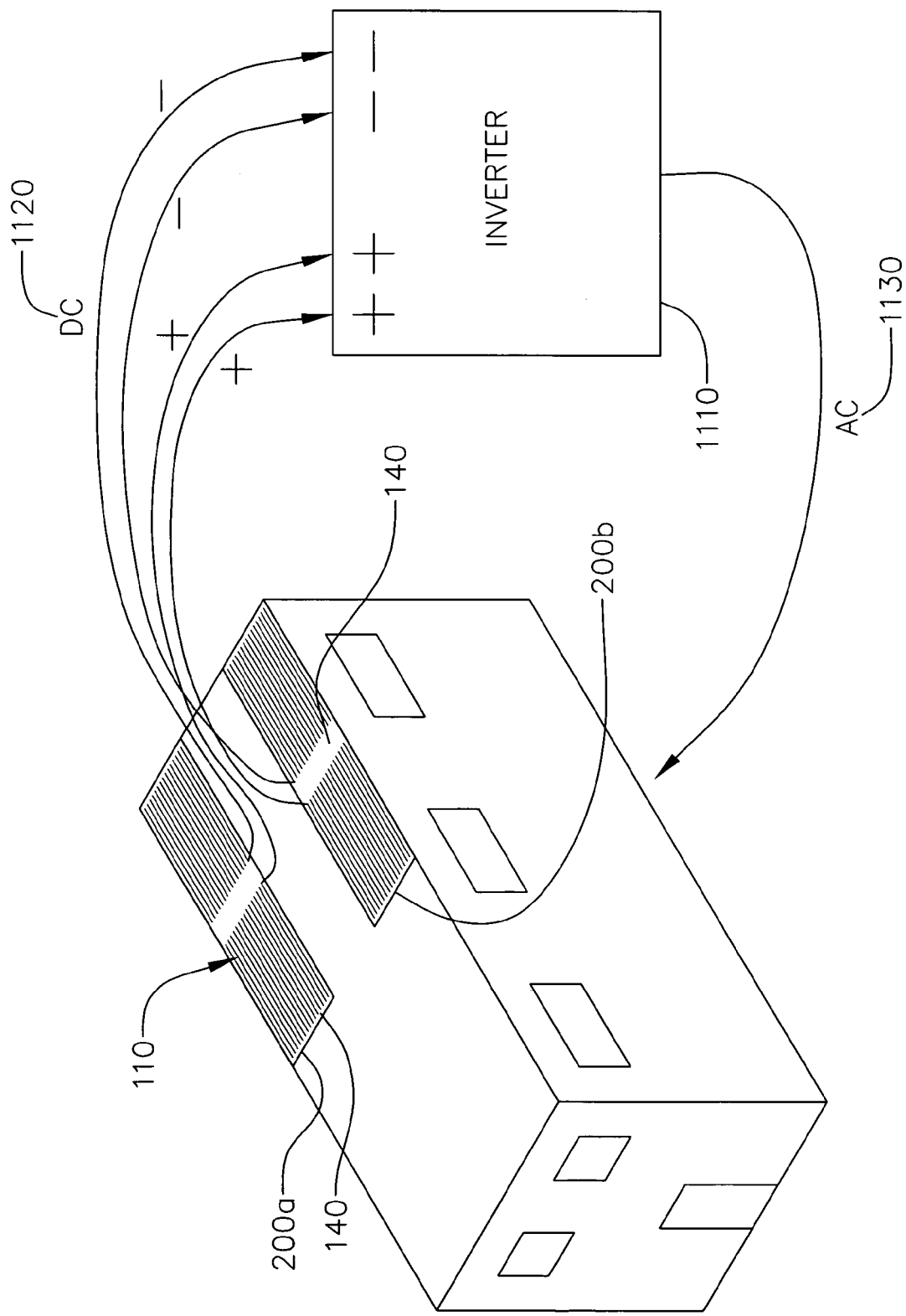

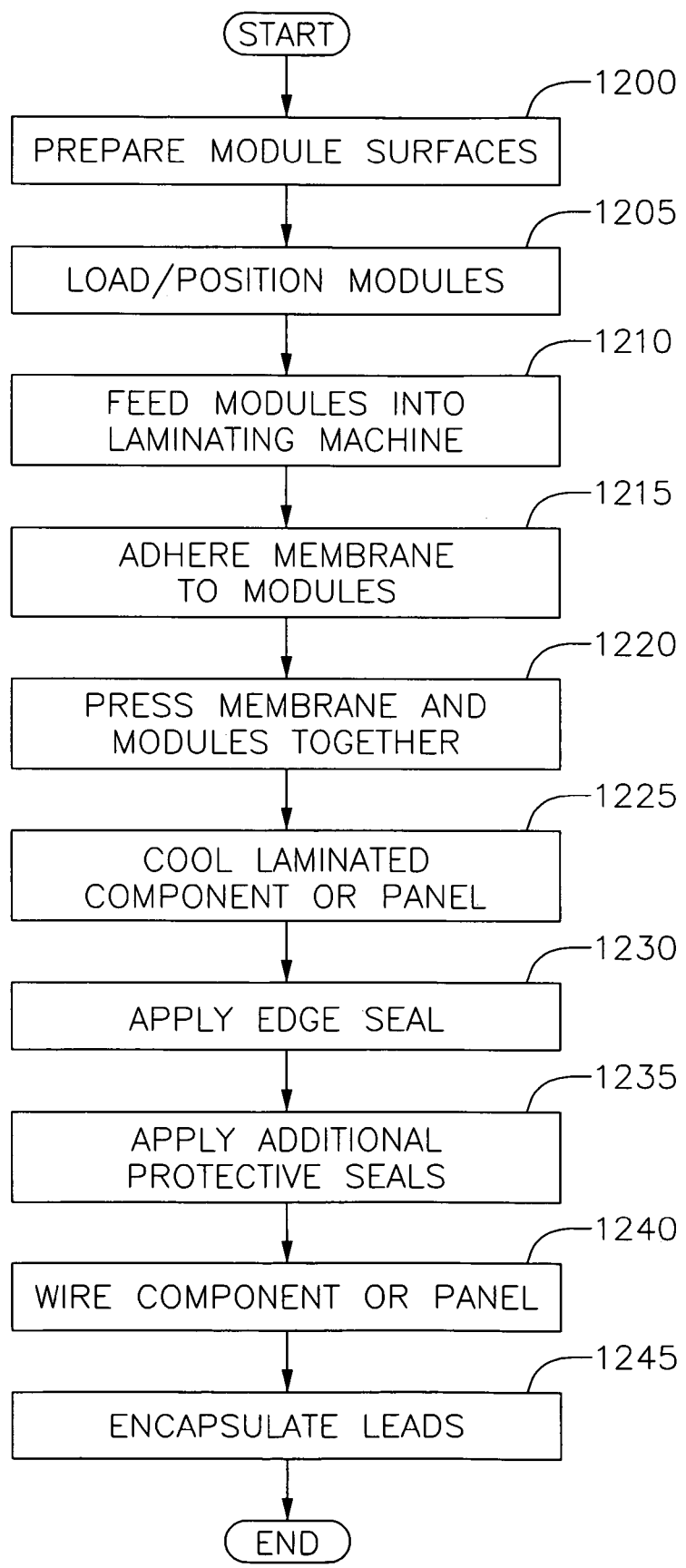

INTEGRATED PHOTOVOLTAIC ROOFING COMPONENT AND PANEL

FIELD OF THE INVENTION

The present invention relates to roofing components, panels and systems, and more particularly, to a photovoltaic roofing component and panel having solar or photovoltaic modules integrated with a flexible membrane to protect a building from environmental elements while also generating electricity.

DESCRIPTION OF RELATED ART

Various types of roofing materials have been utilized to provide building structures protection from the sun, rain, snow and other weather and environment elements. Examples of known roofing materials include clay tiles, cedar and composition shingles and metal panels, and BUR materials, (e.g., both hot and cold applied bituminous based adhesives, emulsions and felts), which can be applied to roofing substrates such as wood, concrete and steel. Additionally, single-ply membrane materials, e.g., modified bitumen sheets, thermoplastics such as polyvinylchloride (PVC) or ethylene interpolymer, vulcanized elastomers, e.g., ethyl propylene diene (monomer) terpolymer (EPDM) and Neoprene, and non-vulcanized elastomers, such as chlorinated polyethylene, have also been utilized as roofing materials. While such roofing materials may be satisfactory for the basic purpose of protecting a building structure from environmental elements, their use is essentially limited to these protective functions.

Solar energy has received increasing attention as an alternative renewable, non-polluting energy source to produce electricity as a substitute to other non-renewable energy resources, such as coal and oil that also generate pollution. Some building structures have been outfitted with solar panels on their flat or pitched rooftops to obtain electricity generated from the sun. These "add-on" can be installed on any type of roofing system as "stand alone" solar systems. However, such systems typically require separate support structures that are bolted together to form an array of larger solar panels. Further, the "add-on" solar panels are heavy and are more costly to manufacture, install and maintain. For example, the assembly of the arrays is typically done on-site or in the field rather than in a factory. Mounting arrays onto the roof may also require structural upgrades to the building. Additionally, multiple penetrations of the roof membrane can compromise the water-tight homogeneity of the roof system, thereby requiring additional maintenance and cost. These "add-on" solar panel systems may also be considered unsightly or an eyesore since they are attached to and extend from a roof. These shortcomings provide a barrier to more building structures being outfitted with solar energy systems which, in turn, increase the dependence upon traditional and more limited and polluting energy resources.

Other known systems have combined roofing materials and photovoltaic solar cells to form a "combination" roofing material which is applied to the roof of the building structure. For example, one known system includes a combination of a reinforced single-ply membrane and a pattern of photovoltaic solar cells. The solar cells are laminated to the membrane and encapsulated in a potting material. A cover layer is applied to the combination for protection. The solar cells are interconnected by conductors, i.e., conductors connect each row in series, with the inner rows being connected to the outer rows by bus bars at one end, and with the other ends terminating in parallel connection bars.

However, known combinations of roofing materials having solar cells can be improved. For example, known combinations of solar cells and roofing typically require multiple internal and external electrical interconnections to be performed on site in order to properly connect all of the solar modules. As a result, substantial wiring, connectors and related hardware are needed to properly wire all of the individual solar cells. Such wiring is typically performed by an electrician rather than a roofer, thereby increasing labor costs and complicating the installation. Additional wire and connection components can also result in composite roofing panels requiring excessive field handling and weight, thereby making storage, transportation, and installation of panels more difficult and expensive. Further, a multitude of interconnections must typically be completed before an installer can run multiple wires or connection lines to an electrical device, a combiner box or an inverter. Finally, increasing the number of wires and interconnections in a panel to be installed under field conditions increases the likelihood that the electrical connection in the panel will be broken, e.g., by variables associated with constructive field conditions or wire connections being exposed to inclement weather and/or other hazards (rodents, pigeons, etc.)

A need, therefore, exists for an integrated photovoltaic roofing component and panel that reduces the need for separate installers to handle roofing materials and solar and related electrical components. The component and panel should also be conveniently stored and transported, and utilize a more efficient wiring system to simplify the installation of photovoltaic roofing components and panels, thereby reducing the maintenance and operational costs of the system.

SUMMARY OF THE INVENTION

The present invention provides an improved integrated solar or photovoltaic roofing component and panel that can be attached to a roofing surface. The improved component and panel includes a flexible membrane sheet and a plurality of elongated solar or photovoltaic modules. The plurality of elongated photovoltaic modules is attached to a top surface of the flexible membrane sheet. Each module is arranged side-by-side or end to end such that the electrical leads are located at adjacent ends of the modules. Thus, the wiring ends can be aligned with or adjacent to each other to form the integrated photovoltaic roofing component or panel.

In further accordance with the invention, the electrical interconnections between individual solar cells of a solar module are completed before the plurality of solar modules are adhered to the flexible membrane. As a result, the installer is not required to connect positive and negative electrodes of each individual solar cell, thereby reducing the electrical interconnections between all the solar cells and modules. Thus, the integrated photovoltaic roofing panel can be unrolled onto a roof of a building structure and installed and properly connected with fewer electrical components and connections than conventional combination photovoltaic systems.

Also in accordance with the present invention, as the cells are preassembled into modules, the edges of the elongated solar modules are encapsulated with a sealant.

According to a further aspect of the present invention, a "panel" includes about two to twelve elongated photovoltaic modules. A panel can include two modules with wiring ends facing each other, or pairs of modules can be arranged in two sub-panels of about one to six modules. The sub-panels are arranged such that the wiring ends of the module(s) are in close proximity to each other on the flexible membrane. Electrodes are mounted in the wiring ends, thereby providing a central location having all of the electrodes to be accessed. Each solar module includes a positive electrode and a negative electrode.

The electrodes can be accessed through apertures defined by apertures cut into in the flexible membrane. Solder sections are inserted through the apertures and connected to the module electrodes. The set of electrodes of the modules may then be connected in a combination of series and parallel connections to complete the wiring of the panel. The wiring series combines into a plug or other connector. The wires, electrodes and solder sections are hermetically sealed within the flexible membrane (utilizing adhesive, hot-air welding or radio frequency welding), and the plug is handily available for connection to another photovoltaic roof panel to form a larger array or system or to an inverter or current converter.

BRIEF DESCRIPTION OF THE DRAWINGS

Referring now to the drawings in which like reference numbers represent corresponding parts throughout:

FIGS. 1A-D illustrate various integrated roofing component configurations having two modules and six modules;

FIG. 8 is an exploded view of an edge of a module showing the electrodes in further detail and apertures formed through a flexible membrane;

FIG. 10 is a cross-section view of the electrodes located beneath the membrane and insulation layers of a photovoltaic integrated component or panel;

FIG. 11 illustrates a system including an integrated photovoltaic roofing panel according to the present invention and an inverter for generating alternating current electricity; and FIG. 12 is a flow diagram of the process of manufacturing an integrated photovoltaic roofing component or panel according to the present invention.

DETAILED DESCRIPTION OF THE PREFERRED EMBODIMENT

Figure 2A:
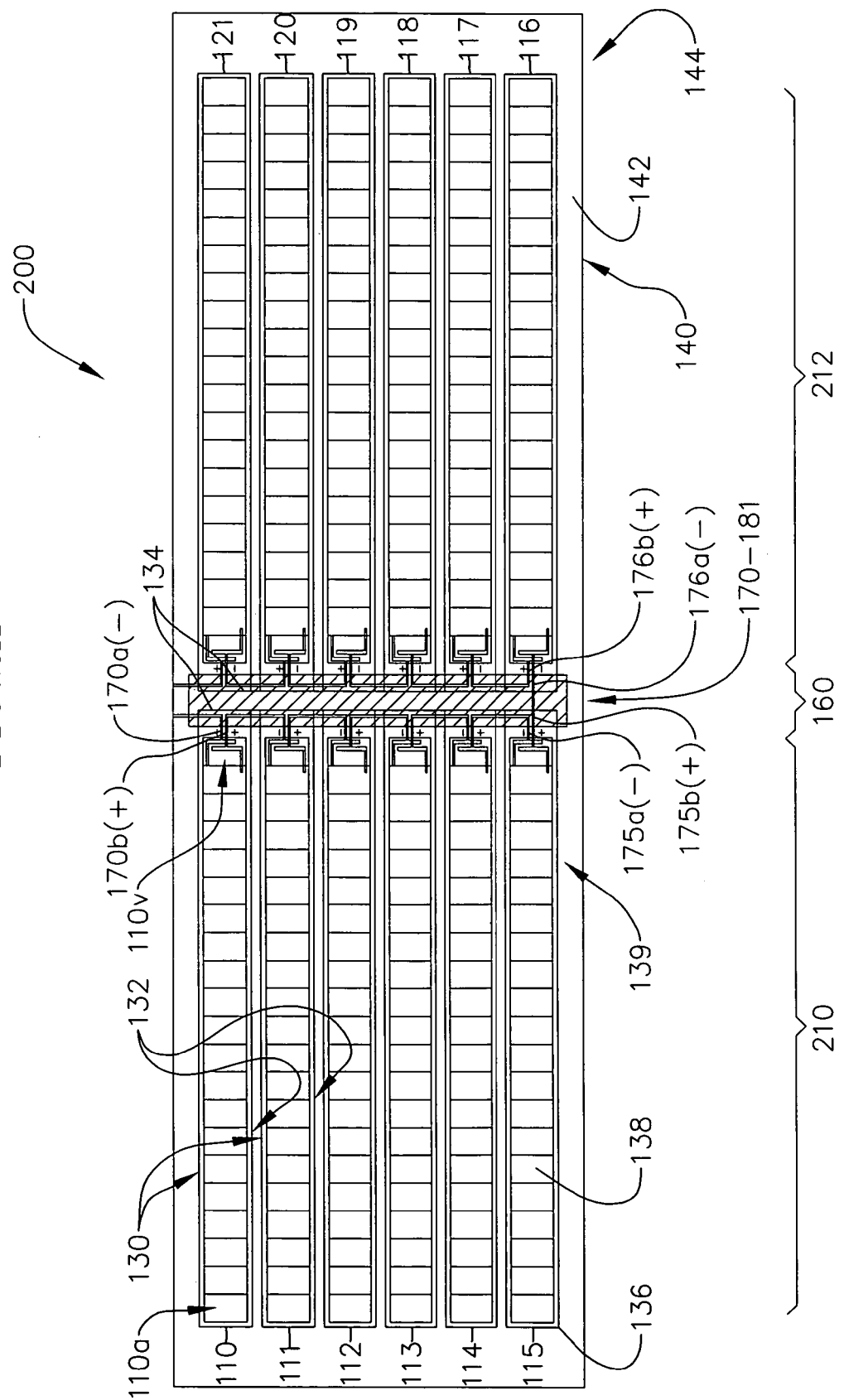
FIG. 2A illustrates an integrated roofing panel having two groups of six modules arranged side-by-side.

The present invention provides a combination roofing component and panel. The component and panel include a plurality of solar or photovoltaic modules ("PV modules") attached to a flexible membrane sheet, such as a single-ply membrane. The modules are arranged adjacent each other, e.g., side-by-side or end-to-end. The ends of the modules have electrical connectors or electrodes that are arranged to face each other or are adjacent or aligned with each other. The electrical connectors extend from internal module electrodes of the solar modules and can extend through apertures formed in a bottom surface of the flexible membrane. The electrical connectors conduct direct current (DC) electricity that may be connected directly to DC electrical devices or connected to an inverter that provides alternating current (AC) electricity to residential, commercial or industrial building structures. Additionally, the AC electricity can also be reverse metered into a utility grid. The ends and sides of the elongated edges of the PV module of a roofing component or panel can be sealed for protection.

Protective outer layers can also be applied over the electrical connectors and on the flexible membrane to hermetically seal the apertures that are used to access the internal module electrodes along with the copper wiring utilized to string the individual modules in a series leaving a "quick-connect" plug readily available to connect with the next PV roofing component or panel.

As a result, the wiring of modules is simplified, and the amount of time required to install photovoltaic roofing panels is reduced since most of the wiring connections are made prior to field installation and encapsulated within a central area, thus minimizing the number of field connections required to connect individual components or panels.

Having generally described some of the features of the present invention, in the following description, reference is made to the accompanying drawings which form a part hereof and which show by way of illustration specific embodiments in which the invention may be practiced. It is to be understood that other embodiments may be utilized as structural changes may be made without departing from the scope of the present invention.

Referring to FIGS. 1A-C, one embodiment of the present invention provides an integrated photovoltaic roofing component 100. One exemplary integrated photovoltaic roofing component 100 includes a plurality of elongated photovoltaic or solar modules 110 and 111 (generally module 110). Each module 110 is a collection of solar cells, e.g., cells 110a-v and 111a-v (generally solar cell 110a). A solar cell 110a is the smallest photoactive unit of a solar module 110. The exemplary modules 110 shown in FIGS. 1A-C include twenty-two (22) photovoltaic cells 110a, but other numbers of solar cells 110a can be utilized.

Each solar module 110 has a first elongated side 130, a second elongated side 132, a front or head or electrode end 134, a rear or butt end 136, a top surface 138, and a bottom surface 139 (not visible in top view of FIG. 1). The bottom surfaces 139 of the modules 110 are bonded, adhered or laminated to a top surface 142 of a flexible membrane 140. A bottom surface 144 (not visible in top view) of the flexible membrane 140, or another layer that is attached to the bottom surface 144, is attached, either partially or fully, to a roofing surface of the building structure such as a roof, wall, canopy, or another building structure.

The modules 110 are arranged such that one end of the modules 110, i.e., the ends having electrical connectors, e.g., soldering pads or wire or copper tape leads 170 and 171 (generally connectors 170) are adjacent each other. Each connector 170 includes a negative lead 170*a* and a positive lead 170*b* that are connected with adjacent module electrodes. The electrical connections can be in series or in parallel. However, for purposes of explanation and illustration, this specification refers to series connections. For example, in FIG. 1A, the elongated sides 130 and 132 of modules 110 and 111 are side by side and adjacent each other. In FIG. 1B, the modules 110 and 111 are adjacent each other and staggered or offset such that the electrode ends 134 are near or adjacent each other. In FIG. 1C, the electrode ends 134 are adjacent and face each other. As shown in FIGS. 1A-C, the electrode ends 134 with the electrical connectors or wire ends 170 are contained within a common or central area 160.

With these exemplary configurations, the time required to connect each photovoltaic module 110 is reduced since the module electrodes 170 can be connected by, for example, soldering, within the central area 160. Thus, the present invention reduces the amount of work performed by electricians.

Persons of ordinary skill in the art will recognize that the exemplary roofing components 100 shown in FIGS. 1A-C can include different numbers of modules 110 having different numbers of solar cells 110*a* and can be arranged in various configurations [and that the exemplary component 100 configurations shown are merely illustrative of these other configurations]. For example, as shown in FIG. 1D, an exemplary roofing component 100 includes six modules 110-115 arranged side-by-side such that the wire connectors 170 are located at the same end 134 and are adjacent each other in the central area 160.

Referring to FIG. 2A, the components 100 shown in FIGS. 1A-D can be used to form an integrated photovoltaic panel 200. An exemplary panel 200 includes two groups of modules 210 and 212 (generally "group 210"), each group having six modules. Specifically, modules 110-115 are arranged side-by-side in the first group 210, and modules 116-121 are arranged side-by-side in the second group 212. In this exemplary panel 200, the modules 110 of each group are arranged so that the electrode or leading ends 134 are adjacent and face each other. For example, the electrode ends 134 of modules 110 and 121 face each other, and the electrode ends 134 of modules 111 and 120 face each other. As a result, the electrode ends 134 with the electrical connectors 170-181 (generally 170) are aligned and the positive and negative leads 170*b* and 171*a* of modules 110 and 111 respectively can be connected in series within the central area 160. Inter-module connections (in this "daisy-chain" example: 170*b*-171*a*, 171*b*-172*a*, . . . 180*b*-181*a*) within the central area 160 are completed in a manufacturing facility prior to field installation thus reducing time and complexity required during on site. To improve the clarity of FIG. 2A, many of the reference designations associated with the inter-module connections are omitted. One example of inter-module connectivity is illustrated in more detail in FIG. 9.

Figure 2B:
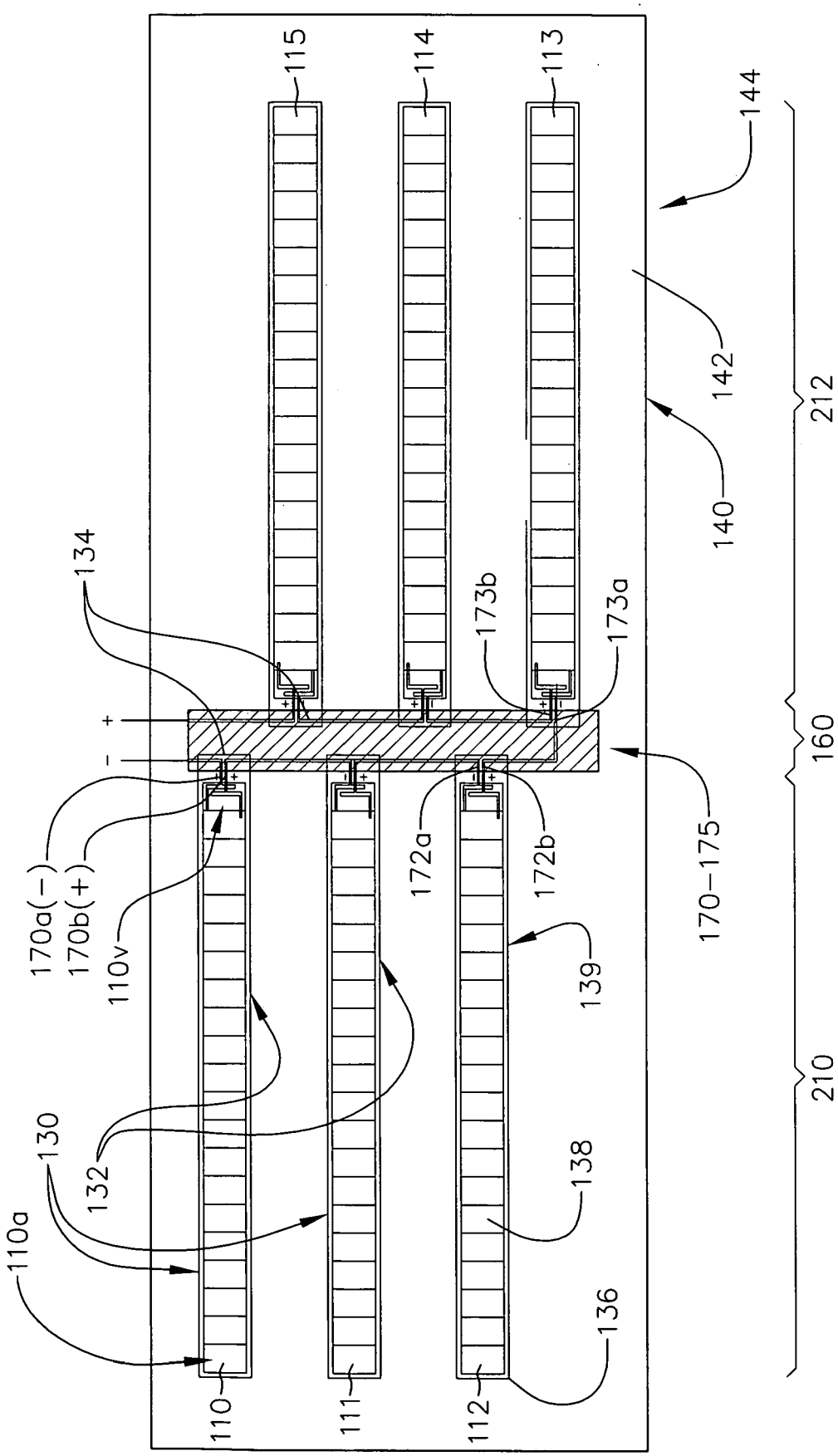
FIG. 2B illustrates an alternative panel configuration with two groups of three modules.

For purposes of explanation and illustration, FIG. 2A shows an integrated photovoltaic roofing panel 200 having twelve modules 110 in two groups 210 and 212, each group having six modules 110. However, many panel 200, module 110, cell 110*a* and group configurations can be utilized. An integrated photovoltaic roofing panel 200 can include different numbers of modules 110 depending on the dimensions of a roofing surface to be covered. For example, as shown in FIG. 2B, a panel 200 includes two groups 210 and 212, in which the modules are adjacent each other and arranged in a staggered configuration. Each group has three modules 110-115 with electrode pairs 170-175. Further, a panel 200 can include modules 110 having different numbers of solar cells 110*a* (FIG. 1 illustrates twenty-two solar cells 110*a* in an exemplary module 110). Thus, the present invention is flexible and adaptable to satisfy the needs and dimensions of a building structure or size of an underlying flexible membrane 140.

Figure 3A:
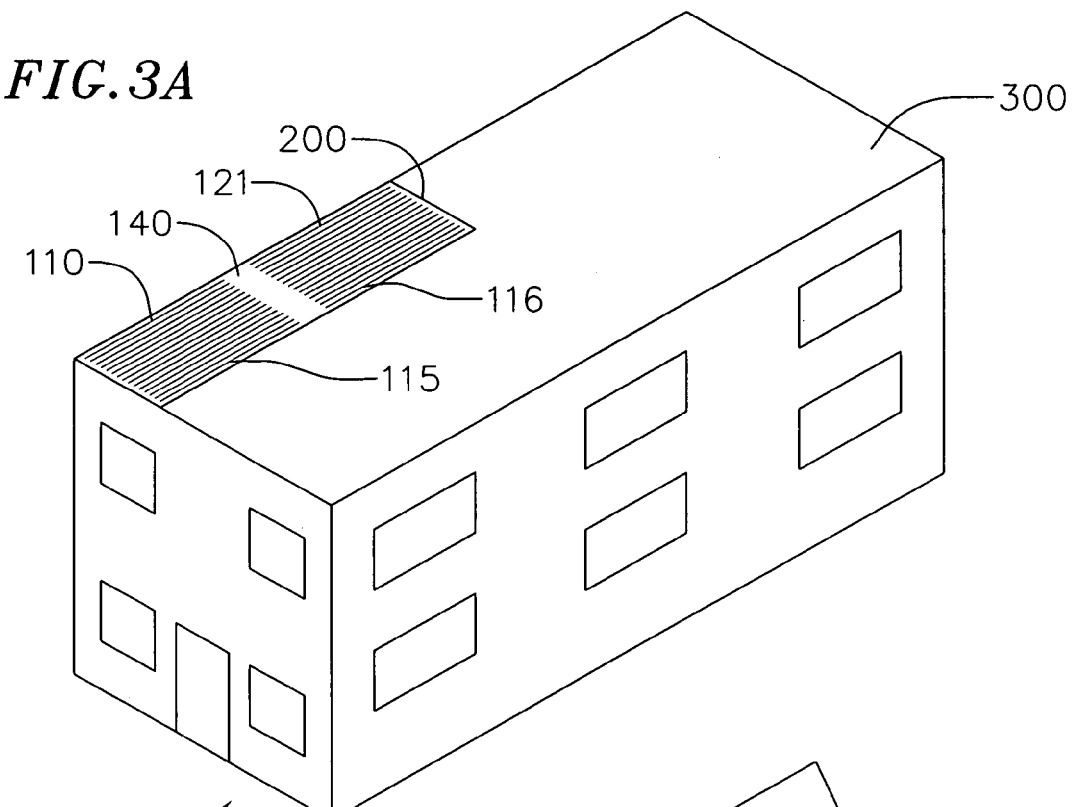
FIGS. 3A-B illustrate the manner in which an integrated photovoltaic roofing component or panel can be applied to a flat and pitched rooftop of a building structure.
Figure 3B:
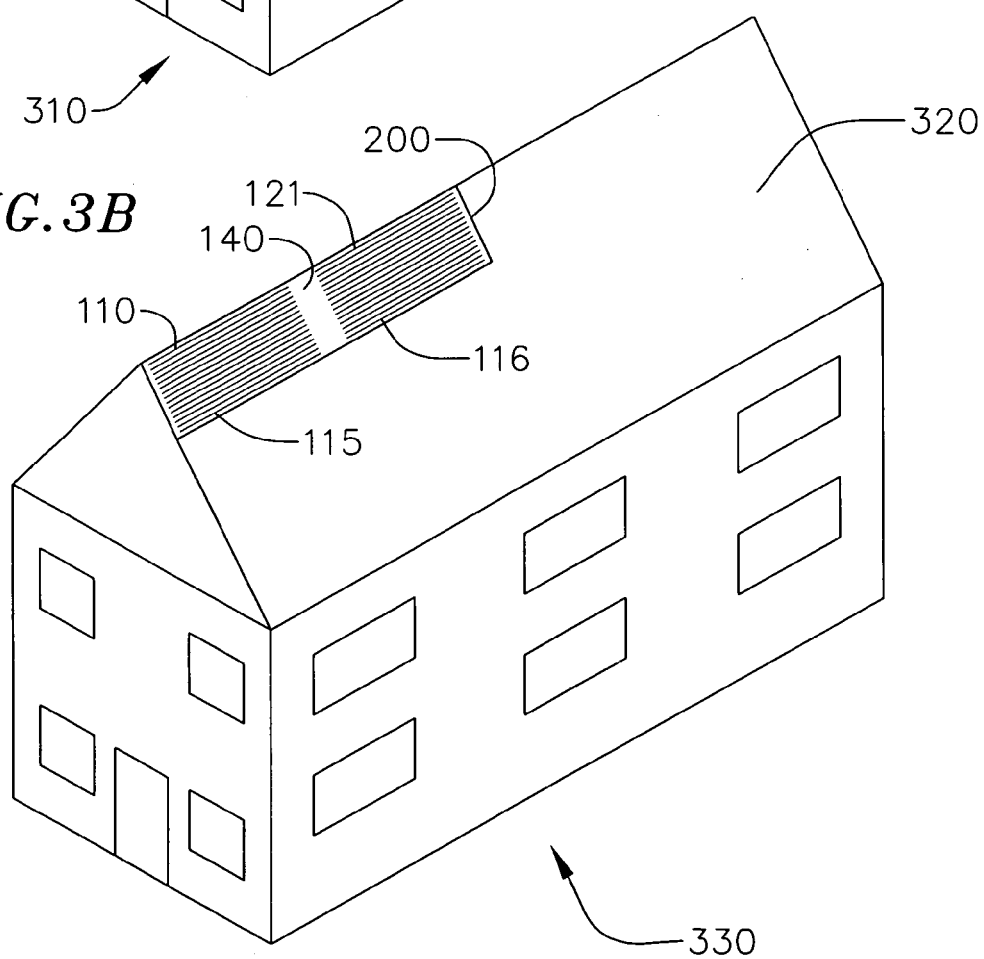

FIGS. 3A-B show an integrated roofing panel 200 applied to a rooftop of a building structure for purposes of protection from the environment, as well as producing electricity. Specifically, FIG. 3A illustrates an integrated photovoltaic panel 200 with modules 110-121 attached to a flexible membrane sheet 140. The membrane sheet 140 is applied to the roofing surface 300 of a building structure 310. The exemplary panel 200 covers a portion of the flat roof surface 300, but the remainder of the roof 300 can be similarly covered by other panels 200 or smaller components 100 as needed. Similarly, FIG. 3B illustrates a panel 200 with modules 110-121 attached to a flexible membrane sheet 140 that is applied to a pitched or angled roof surface 320 of a building structure 330. The remainder of the roof 320 can also be similarly covered.

Persons of ordinary skill in the art will recognize that more than one panel 200 or component 100 can be installed on a rooftop or other building surface or structure depending on the size of the surface and desired solar capabilities. Further, the panels 200 can have different numbers and sizes of solar modules 110 and flexible membrane sheets 140. For purposes of illustration, this specification generally refers to modules attached to a single membrane sheet, but various sizes and numbers of flexible membrane sheets can be used. Thus, the integrated photovoltaic panel 200 and component 100 of the present invention are efficient, effective and flexible photovoltaic roofing materials with simplified wiring.

FIGS. 4-12 illustrate various aspects of an integrated photovoltaic component 100 and panel 200, electrical connections, a system incorporating a component 100 or panel 200, and a method of manufacturing a component or panel. While the following description generally refers to a photovoltaic roofing "panel", persons of ordinary skill in the art will recognize that the description also applies to an integrated photovoltaic roofing component 100 or a combination of one or more components and panels.

Figure 4:
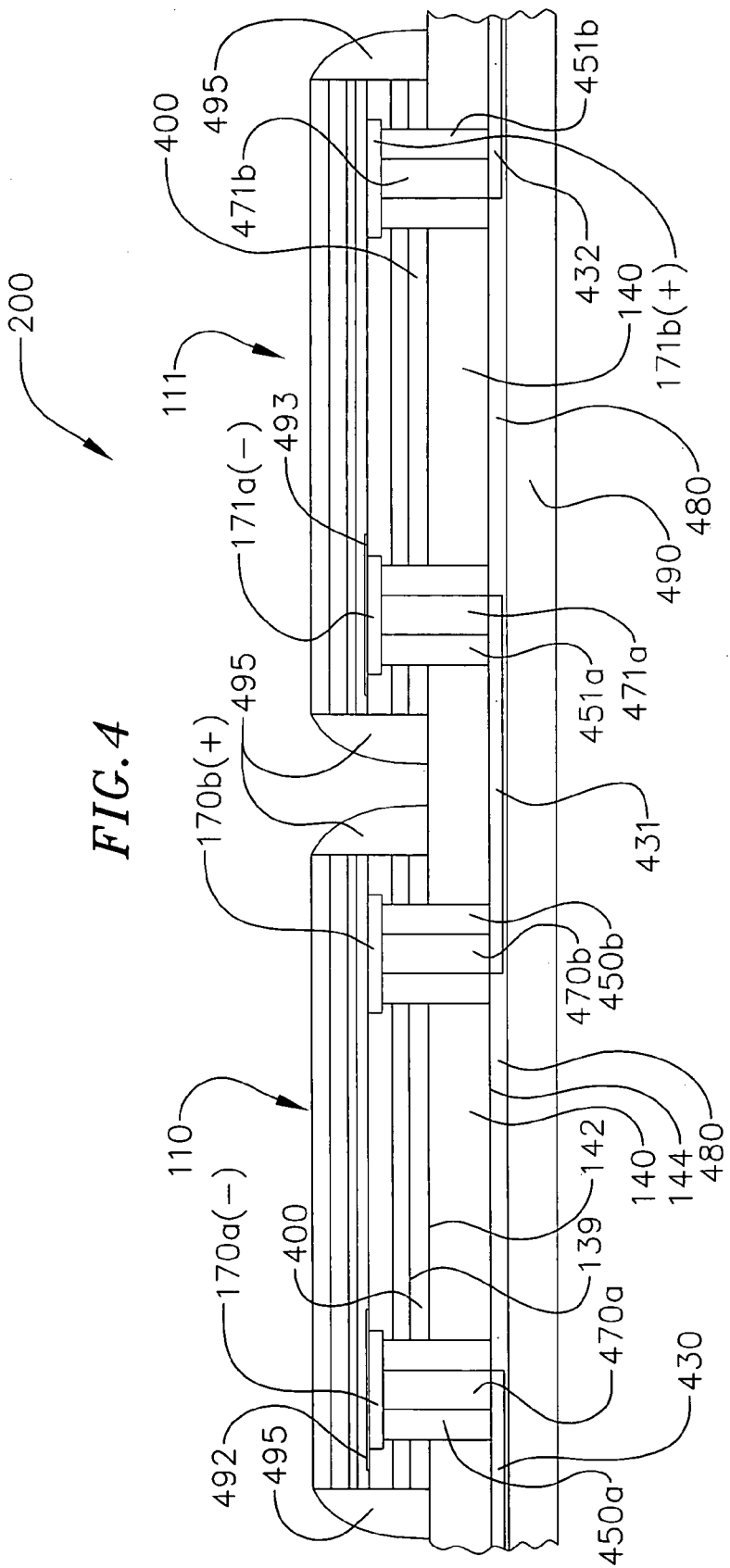
FIG. 4 is a cross-section view of an integrated photovoltaic roofing component or panel according to the present invention.

FIG. 4 shows a general cross-section of an integrated photovoltaic roofing panel 200 of the present invention. An exemplary solar module 110 or 111 (generally 110) that is adhered to the flexible membrane 140 can be solar module model no. PVL-128 or a UNI-SOLAR® PVL solar module, available from Bekaert ECD Solar Systems, LLC, 3800 Lapeer Road, Auburn Hills, Mich. This specific exemplary solar module 110 is adhered to the top surface 142 of the flexible membrane 140 with an adhesive 400. One exemplary adhesive 400 that can be used to bond or laminate the bottom surface 139 of the module 110 to the top surface 142 of the flexible membrane 140 is a reactive polyurethane hot-melt QR4663, available from Henkel Henkel KGaA, Kenkelstrasse 67, 40191 Duesseldorf, Germany.

One exemplary flexible membrane sheet 140 that can be used is a single-ply membrane, e.g., an EnergySmart® S327 Roof Membrane, available from Sarnafil, Inc., Roofing and Waterproofing Systems, 100 Dan Road, Canton, Mass. Persons of ordinary skill in the art will recognize that while one exemplary flexible membrane 140 is selected for purposes of explanation and illustration, many other flexible membranes and single-ply membranes can be utilized. For example, alternative single-ply membranes 140 that can be used include modified bitumens which are composite sheets consisting of bitumen, modifiers (APP, SBS) and/or reinforcement such as plastic film, polyester mats, fiberglass, felt or fabrics, vulcanized elastomers or thermosets such as ethyl propylene diene (monomer) terpolymer (EPDM) and non-vulcanized elastomers such as chlorinated polyethylene, chlorosulfonated polyethylene, polyisobutylene, acrylonitrite butadiene polymer.

The module 110 includes negative and positive internal electrode soldering pads 170a(−) and 170b(+), respectively. Insulating tape 492 is applied to soldering pad 170a. Apertures 450a and 450b are formed through the flexible membrane 140, adhesive 400 and a lower portion of the module 110, to access the internal module soldering pads 170a and 170b. Solder connections or sections 470a and 470b are formed within the apertures 450a and 450b. The module 111 includes a similar arrangement of negative and positive electrode soldering pads 171a(−) and 171b(+), apertures 451a and 451b, and solder sections 471a and 471b. Insulating tape 493 is applied to soldering pad 171a.

The solder sections 470a and 470b provide an electrical connection between the internal module soldering pads 170a and 170b and respective inter-module wire connection leads 430 and 431. As a result, the internal module negative electrode 170a, solder section 470a, and connection electrode 430 provide an electrical circuit with the terminus of wire 430 ending in a quick-connect plug (not shown in FIG. 4). The internal positive module electrode 170b, solder section 470b, and inter-module connection lead 431 provide an electrical circuit connecting in series to the adjacent internal negative module electrode 171a through solder section 471a. In this series wiring example, the pattern of wiring positive to negative between adjacent modules is continued until all additional module electrodes are "daisy-chained" to complete the series circuit. The final positive internal module connection to electrode 181b(+) (see FIGS. 2 and 9) terminates the series wiring with connection to a quick-connect plug (not shown in FIG. 4) similar to termination to wire 430.

If necessary, one or more insulative layers 490 can be applied to the bottom surface 144 of the flexible membrane 140 and over the connection electrodes 430 and 431 and additional module electrodes in the electrical path for protection and support. The insulative layer 490 can be applied by an adhesive layer 480.

An edge sealant 495 can be applied to the edges of modules 110 and 111. More specifically, an edge sealant 495 can be applied to seal or cover any gaps or an edge between an adhesive layer 400 and the bottom surfaces of modules 110 and 111, as well as an edge between the adhesive layer 400 and the top surface 142 of the membrane 140.

Panels 200 having the general configuration shown in FIG. 4 can be rolled up for storage and transportation. For example, typical rolls of a flexible membrane 140 can have a width as large as about 10 feet and a length cut and rolled to between about 30 or 100 feet. Modules 110 can be applied to the flexible membrane 140 and cut to various dimensions as needed, and are then unrolled and applied to a rooftop.

Figure 5:
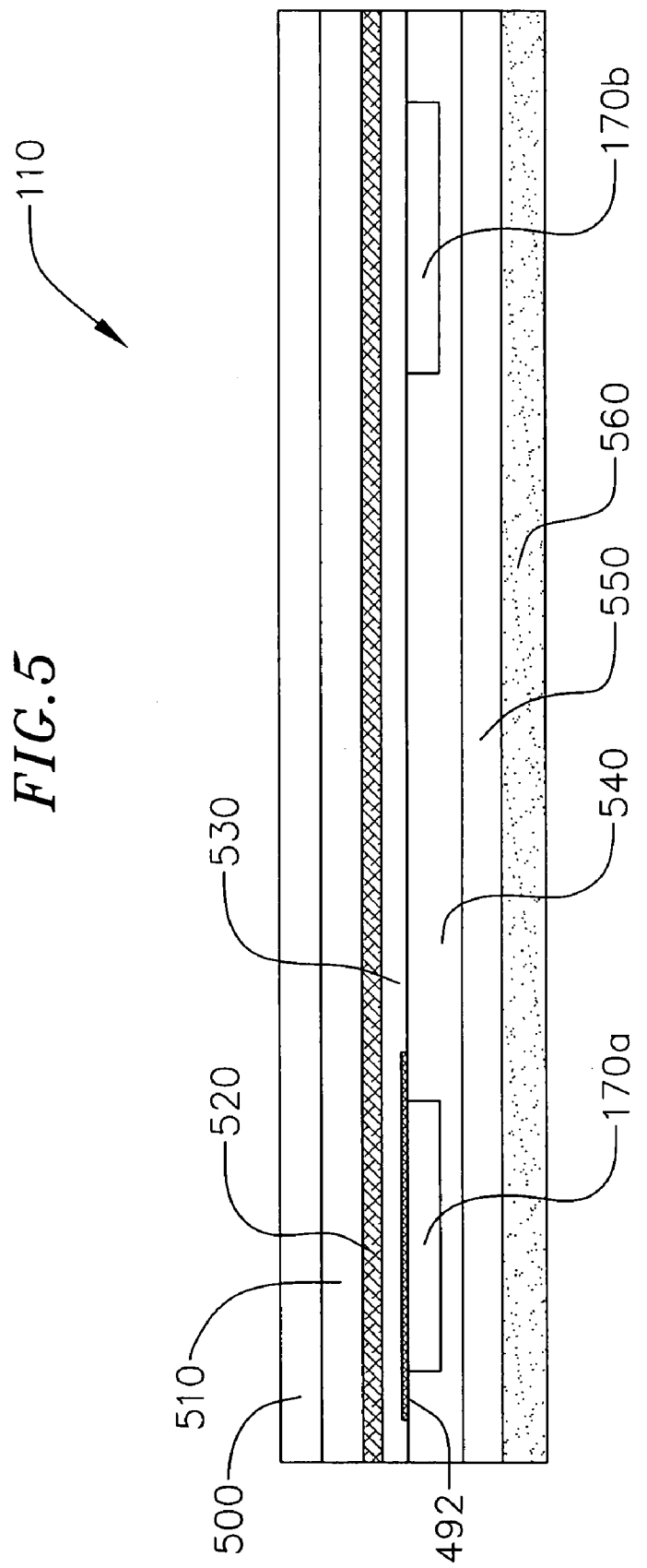
FIG. 5 is a cross-section view of an exemplary photovoltaic module.

FIG. 5 shows a cross-section of a solar module 110 that is generally representative of the exemplary solar module 110 model no. PVL-128 or a UNI-SOLAR® PVL solar module, available from Bekaert ECD Solar Systems, LLC, 3800 Lapeer Road, Auburn Hills, Mich. This particular solar module 110 includes twenty-two solar cells 110a (as illustrated in FIGS. 1 and 2A-B).

This particular exemplary solar module 110 includes a top Tefzel layer 500 having a thickness of about two (2) mil (1 mil=0.001 inch), a first ethylene-propylene rubber (EVA) layer 510 having a thickness of about 26 mil beneath the Tefzel layer 500, a fiberglass layer 520 having a thickness of about 15-20 mil beneath the EVA layer 510, a photoreactive or solar cell layer 530 having a thickness of about 5 mil beneath the fiberglass layer 520, a second EVA layer 540 having a thickness of about 8 mil beneath the photoreactive layer 530, and a Tedlar layer 550 having a thickness of about 2-5 mil beneath the second EVA layer 540.

FIG. 5 also shows the negative internal electrode 170a and the positive internal electrode 170b mounted within the second EVA layer 540 of the module 110. The negative internal electrode 170a is insulated from the photoreactive layer 530 by an insulation strip or layer 492 to prevent a short circuit.

The exemplary solar module 110 model no. PVL-128, as manufactured, typically includes a factory bonding adhesive 560 (shown as dotted line) on the underside of the module laminate, i.e., applied to the underside of the Tedlar layer 550. However, for purposes of attaching or laminating the solar module 110 to the top surface 142 of the flexible membrane 140 in the present invention, this factory adhesive 560 can be replaced by the hot melt adhesive 300 mentioned earlier or an adhesive applied using another adhesion process.

Figure 6:
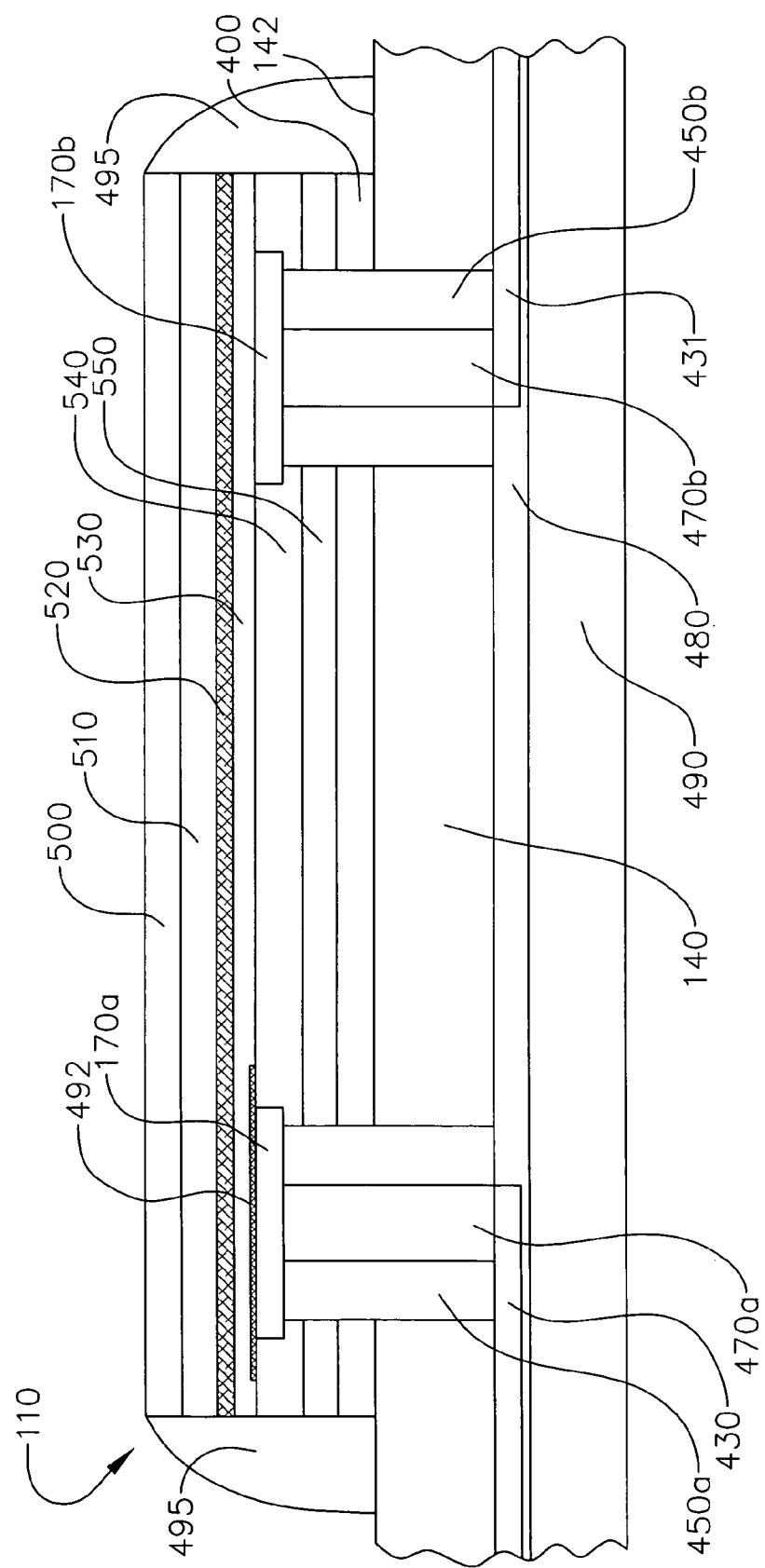
FIG. 6 is a cross-section view of the exemplary photovoltaic module of FIG. 5 that is laminated or adhered to a flexible membrane to form an integrated roofing component or panel.

FIG. 6 illustrates a cross-section of an integrated photovoltaic roofing panel 200 in which the module 110 (with components illustrated in FIG. 5) is laminated or adhered to the top surface 142 of the flexible membrane 140. Specifically, apertures 450a and 450b are formed through the membrane sheet 140, adhesive 400, and the bottom surface or underside of the module, i.e., through the Tedlar layer 550 and partially through the second EVA layer 540 to access the internal electrodes 170a and 170b within the second EVA layer 540. FIG. 6 also shows edge seals 495 applied over the membrane layer 140, and to the adhesive 400, and module 110.

After the solder sections 470a and 470b are applied to the internal module electrodes 170a and 170b through the apertures 450a and 450b, and the connection electrodes 430 and 431 are connected to respective solder sections 470a and 470b, a second adhesive layer 480 can be applied to the bottom surface 144 of the membrane 140. Additionally, an insulative membrane layer 490 can be applied to the bottom of the adhesive 480 (or to the bottom surface 144 of the membrane 140 if the adhesive 480 is not utilized). The insulative layer 490 insulates and encapsulates the connection electrodes 430 and 431 and additional module electrodes in the electrical path. An exemplary membrane layer 490 that can be used is 48 mil S327, available from Sarnafil 100 Dan Road, Canton, Mass.

The bottom surface of the panel 200, is applied to the roofing surface or substrate (e.g., roof sections 300, 320 in FIG. 3) or other building structure surface. Thus, when the panels 200 are to be installed, the panel roll can be unrolled onto the rooftop and attached thereto using various known techniques (e.g., various adhesives utilized to adhere the flexible PV panel to the substrate or mechanical attachment utilizing screws and plates, combined with hot air welding, solvent welding or radio frequency (RF) welding of the laps or seams. Also, double-sided adhesive tapes, pre-applied adhesive with removable release paper, techniques may be utilized.)

Figure 7A:
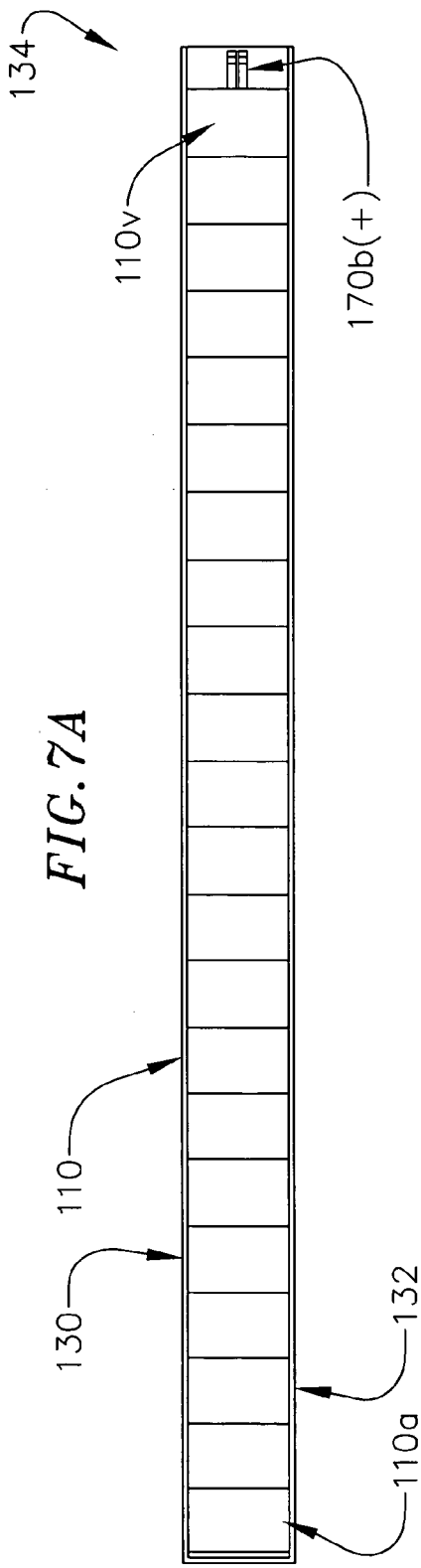
FIGS. 7A-C are respective top, bottom and exploded views of module electrodes.
Figure 7B:
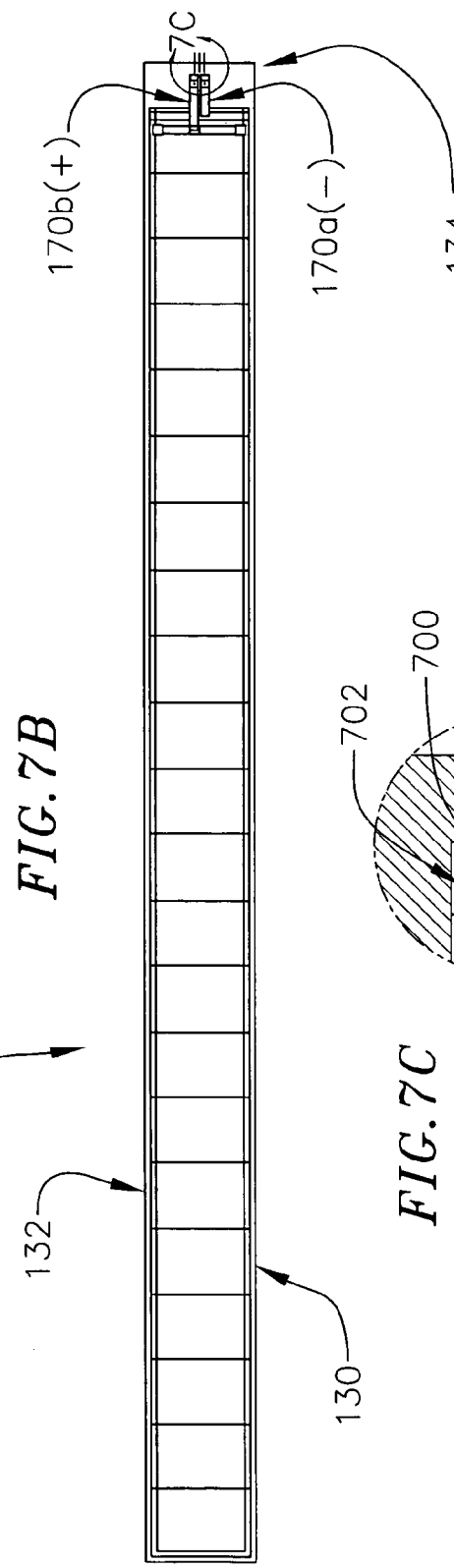

As illustrated in FIGS. 7A-B, electrode leads 170a and 170b connected to the connection electrodes 430 and 431

Figure 7C:
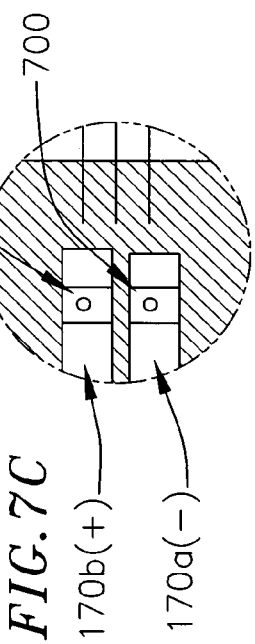

(not shown in FIGS. 7A-B) are located near the edge of the module, e.g., the electrode or reference edge 134. FIG. 7C shows the ends of the leads 170a and 170b having termination holes 700 and 702 for series connection to wires or other connectors.

The wire or copper tape leads 170a and 170b are illustrated in further detail in FIG. 8. Specifically, the leads 170a and 170b are connected respectively to the connection electrodes 430 and 431. The leads 170a and 170b extend perpendicular relative to the reference edge 134 of the module 110 and over the membrane 140. In the example for series wiring shown in FIG. 2A, the inter-module connection electrodes are connected in this pattern with the exception of the inter-module connection between the positive internal module electrode 175b of module 115 and the negative internal module electrode 176a of module 116. In this case, the single electrical lead making the electrical circuit between 175b and 176a (See FIG. 2A) extends across the reference edges 134 of modules 115 and 116. Thereafter, a wiring pattern similar to modules 110 through 115 is completed for modules 116 through 121.

Figure 9:
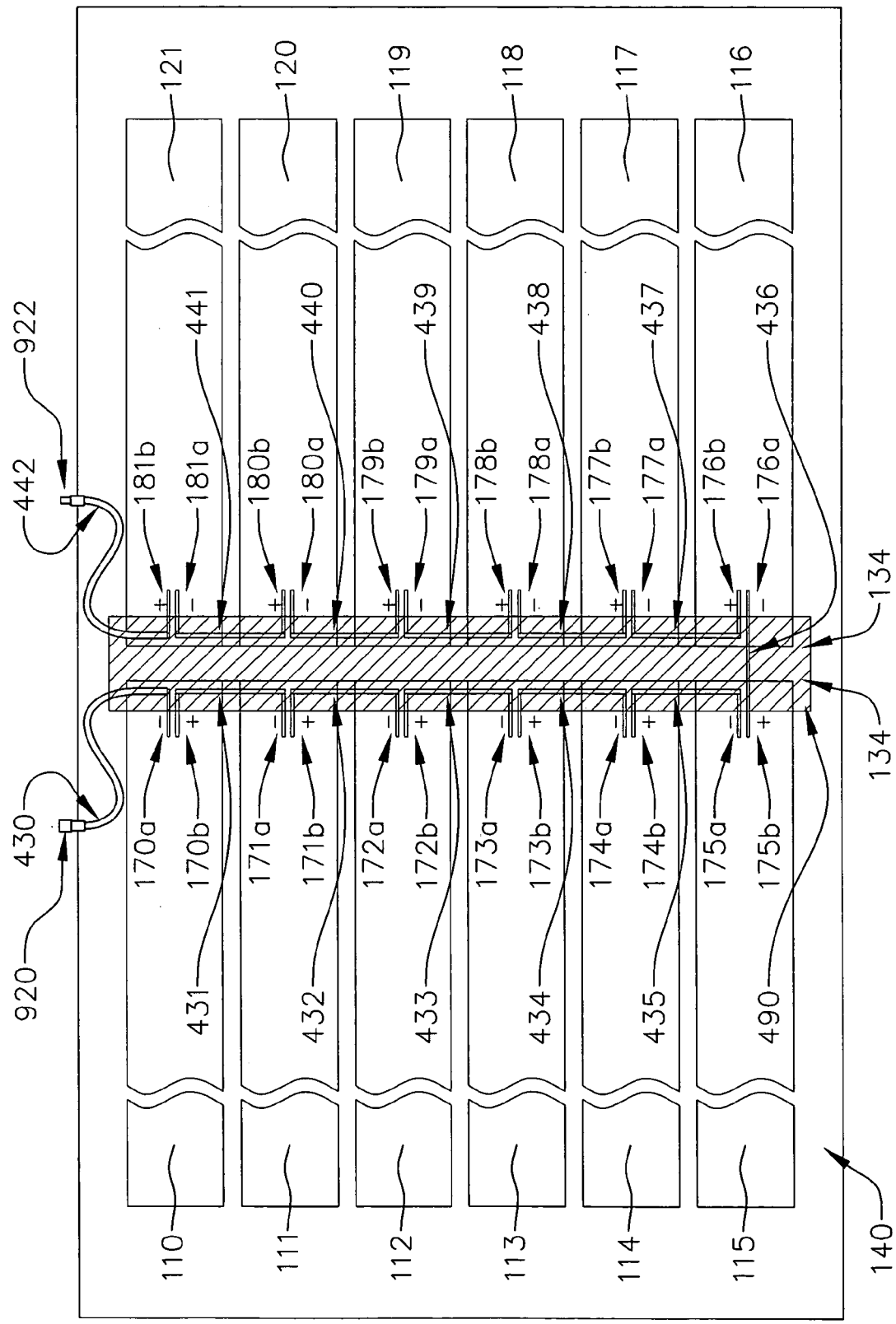
FIG. 9 is a top view of an integrated photovoltaic roofing panel having two groups of six modules arranged side by side and facing each other with electrodes connected in series.

As illustrated in FIG. 9, the wire or internal module copper tape leads 170a and 170b are connected in series with connectors 430 and 431 of module 110. Specifically, the positive leads 170b-174b and negative leads 171a-175a of modules 110-115 of the first group 210 are connected in series by connectors 431-435, and the positive leads 176b-180b and the negative leads 177a-181a of modules 117-121 are connected in series by connectors 437-441 in the second group 212. The negative lead 176a and the positive lead 175b of modules 116 and 115, respectively, are connected by cross connector 436, thus completing the series connection of the modules 110-121. Negative and positive "quick-connect" plugs 920 and 922 terminate the ends of leads 430 and 442 external to the encapsulation membrane 490 and are readily available to connect to the adjacent PV panel. Further, one or more of these series connected panels can be connected in parallel to an inverter. Other electrical connections can also be used depending on the needs of a particular system, e.g., panels can be connected in parallel.

For example, a panel 200 having twelve modules 110 wired with the previously described series arrangement can provide 1536 Wstc and 571.2 Voc output. This configuration also contains the wiring for the solar modules 110 within the middle section 160, thereby simplifying the installation procedure. The output connections 430 and 442 can then be directed to a device which can process the solar energy and provide electricity to the building structure or reverse metered into a power grid. Further, a protective coating or layer 490 can be applied over the wire leads 170a-181a and 170b-181b for protection from inclement weather, animals, and other environment factors.

FIG. 10 shows an illustrative example of a cross-section of an integrated photovoltaic component 100 or panel 200 that is attached to a roof or decking. In this example, an insulation layer 490 is laid onto a decking 1000 with, for example, an underlying insulation substrate 1010. A groove 1020 is cut within the insulation layer 490. An electrical conduit 1030 within the groove 1020 contains the cables 430 and 442 (see also FIG. 9) connected by cable quick-connects 920 and 922 to home-run cable quick-connects 1050 and 1052 and extending therefrom as DC cables to either electrical combiner box and/or inverter.

FIG. 11 generally illustrates a system 1100 for providing electricity generated by integrated photovoltaic roofing panels 200 of the present invention to a building structure. Generally, the panels 200a and 200b are manufactured and wired as previously described and illustrated. The series leads or electrodes from the modules are connected in parallel to an interface or current converter, such as an inverter 1110, for converting the Direct Current (DC) electricity 1120 generated by the solar panels 200a and 200b into Alternating Current (AC) electricity 1130 at a certain voltage that can be utilized by the building structure or reverse metered into a power grid. One exemplary inverter 1110 that can be used is a photovoltaic static inverter, model no. BWT10240, Gridtec 10, available from Trace Technologies, Corp., Livermore Calif. These exemplary inverters 1110 are rated up to 600 volts DC input; 10 kW, 120/240 or less, with single-phase output. Other inverters that can be utilized include a string inverter or the Sunny Boy®2500 string inverter, available from SMA America, Inc., 20830 Red Dog Road, Grass Valley, Calif. A further exemplary inverter 1100 that can be used is the Sine Wave Inverter, model no. RS400, available from Xantrex Technology, Inc., 5916 195th Street, Arlington, Wash. or a 20 kW Grid-Tied photovoltaic inverter, model no. PV-20208, also available from Xantrex.

Having described the integrated photovoltaic roofing component 100, panel 200, and system 1100, this specification now generally describes the process for manufacturing a component 100 or panel 200 and the processing of the modules, membrane, adhesives and electrodes, and wire leads. Generally, the process involves positioning modules to be laminated, laminating the modules and flexible membrane together, sealing the edges of the laminated panel as necessary, and wiring the panel.

Referring to FIG. 12, initially, the module surfaces are prepared or activated in step 1200. Specifically, the bottom or Tedlar surfaces of the modules are activated by using, for example, a flame/corona treatment system. A combination of flame and electrical discharge corona treatment activate module surfaces which will receive a first hot-melt adhesive used to laminate the bottom surfaces of the modules to the top surface of the flexible membrane sheet. The substrate of the module can be cleaned and roughened to prepare for application of adhesive. For example, the module can travel across a flame (e.g., a 175 mm wide burner head (FTS 201) fueled by natural gas) at a rate of about 30 to 50 meters per minute. The ends or sides of the modules are also exposed to a gas flame (or a corona in a combination gas/electric discharge flame) to activate the edges for application of a second hot-melt adhesive (edge adhesive). Module edges can be exposed to the flame at a rate of about 5 to 10 meters/minute.

In step 1205, the modules are loaded into position with, for example, a suction alignment system that loads the modules from a cassette into position onto a processing table or conveyor.

In step 1210, the modules are fed into a laminating machine, and a first adhesive is applied to a substrate surface of the module. The adhesive can metered or periodically applied to the bottom surface of the modules if the modules are spaced apart from each other.

In step 1215, the flexible membrane is adhered to the modules. The membrane can be placed in tension using a roller system for better mating of the membrane and the hot-melt coated modules.

In step 1220, the module and the membrane are pressed together with a smoothing unit (calendar rollers) to mate or adhere the module and membrane together. The lamination pressure is set either by gap or pressure up to, for example, about 300 N/cm for a total of 10,000N over the length of the calendar rollers.

In step 1225, the laminated product is permitted to set and cool.

In step 1230, a second adhesive, e.g., a HENKEL MM6240 adhesive, is applied to the elongated, leading, and trailing edges of the panel as a protective seal or pottant to protect the edges against weathering, moisture and other environmental pollutants that could damage the modules or cause the modules to be separated from the flexible membrane. Exemplary edge seals or pottants that can be utilized include ethylmethyl acrylate, poly-n-butyl-acrylate, EVA and elastomeric pottants EPDM and polyurethane.

In step 1235, as necessary, additional seals and protective layers can be applied to the panel. For example, a top protective layer can also be applied to the modules for further protection. The cover layer provides further protection against environmental elements while being transparent or mostly transparent to sunlight (e.g., 90% transmission). Example outer layer materials that can be used include, but are not limited to, Tedlar, a polyvinylfluoride (PVF), Kynar, a poly-vinylidene fluoride, flexible plexiglass DR-61K and V811 from Rohn & Hass.

In step 1240, the panels are then electrically wired and cut to length. Series wiring of a panel is accomplished using flat copper tape which is soldered between adjacent modules. Soldering points are accessed by cutting circular holes through the bottom layer or roof side of the flexible membrane at the location of the module solder pads. A power lead for each panel includes two "quick-connect" plugs which are soldered to the positive and negative terminal leads of the series wired modules. The power leads are connected to other panels, to a combiner box, to DC electrical devices or directly to a power inverter.

In step 1245, after the electrical lead soldering is completed, the copper tape and power leads are encapsulated in PVC by hot-air welding, RF welding or hot-melt adhering an adequate strip of compatible flexible membrane to the central underside of the larger flexible membrane thereby fully encapsulating and hermetically sealing and insulating the electrical solder connections of the panel.

Having described various embodiments of the present invention, persons of ordinary skill in the art recognize that the integrated photovoltaic component, panel and system of the present invention overcomes the shortcomings of conventional roofing materials, add-on solar modules, and known panels that also include solar modules to provide a more effective roofing solution. The present invention reduces the amount of wiring and related hardware that is typically needed to connect solar modules and connect solar modules to an inverter. The present invention also simplifies wiring since fewer connections are made, and the fewer connections are made within a central area.

The foregoing description of embodiments of the present invention have been presented for the purposes of illustration and description. It is not intended to be exhaustive or to limit the invention to the precise forms disclosed. Many modifications and variations are possible in light of the above teaching. For example, the integrated photovoltaic roofing panel can be used with many different modules, flexible membranes, adhesives, and arrays of module configurations. Additionally, the integrated photovoltaic component and panel can be used not only as a roofing component, but can also be applied to walls, canopies, tent structures, and other building structures. Further, the integrated photovoltaic roofing panel can be utilized with many different building structures, including residential, commercial and industrial building structures. It is intended that the scope of the invention be limited not by this detailed description, but rather by the claims appended hereto.

What is claimed is:

1. An integrated photovoltaic roofing component for attachment to a roofing surface, comprising:
    a flexible membrane having a top surface and a bottom surface, said bottom surface for application to the roofing surface;
    a plurality of photovoltaic modules, each module comprising a top surface, a bottom surface, first and second sides and front and rear ends, each module further comprising a plurality of solar cells, the plurality of modules arranged side-by-side and attached to said top surface of said flexible membrane; and
    an electrical connection between a first module and a second module of the plurality of modules, the electrical connection comprising one of a positive lead and a negative lead extending from the first module of the plurality of modules, the other of a positive lead and a negative lead extending from the second module of the plurality of modules, and an intermodule connection lead between the positive lead and the negative lead;
    wherein the entire intermodule connection lead from a location adjacent the positive lead to a location adjacent the negative lead runs along the bottom surface of the flexible membrane.

2. The component of claim 1, wherein said plurality of modules are attached to said top surface of said flexible membrane with an adhesive.

3. The component of claim 2, wherein the adhesive comprises a hot-melt adhesive.

4. The component of claim 1, wherein said flexible membrane comprises a single-ply membrane.

5. The component of claim 4, wherein said single-ply membrane is a thermoplastic membrane sheet, an elastomeric membrane sheet, or a reinforced bituminous membrane sheet.

6. The component of claim 1, wherein each module includes about 22 solar cells.

7. The component of claim 1, wherein each module is flexible.

8. The component of claim 1 wherein said said flexible membrane has an aperture therethrough and the electrical connection between the first and second modules passes through the aperture, further comprising an insulative layer applied to said bottom surface of said flexible membrane that covers said aperture defined by said flexible membrane.

9. The component of claim 8, wherein solder is located in the aperture to electrically connect at least one of the positive and negative leads to the intermodule connection lead.

10. The component of claim 1, further comprising a seal along an elongated edge between said flexible membrane and an elongated photovoltaic module.

11. The component of claim 1, further comprising a seal along an end of said flexible membrane and an elongated photovoltaic module.

12. The component of claim 1, wherein said flexible membrane and said plurality of elongated photovoltaic modules attached to said flexible membrane can be rolled upon themselves.

13. The component of claim 1, wherein said plurality of modules are attached to a single sheet of flexible membrane.

14. The component of claim 1, wherein a first group of two or more modules is arranged side-by-side and a second group of two or more modules is arranged side-by-side, wherein said first and second groups are also arranged end-to end so that one or more electrical leads are located at adjacent ends of the modules of said first group and said second group.

15. The component of claim 14, wherein said one or more electrical leads of said first and second groups of modules are located in a central area.

16. The component of claim 1, wherein a first group of two or more modules are arranged side-by-side, and a second group of two or more modules are arranged side-by-side, said modules of said first and second groups being staggered.

17. The component of claim 16, wherein said one or more electrical leads of said first and second groups of modules are adjacent each other.

18. The component of claim 1, wherein each photovoltaic module comprises a prefabricated structure.

19. The component of claim 1, wherein each photovoltaic module comprises a prefabricated, unitary structure.

20. The component of claim 19, wherein each prefabricated, unitary structure includes encapsulated wiring interconnections between the solar cells.

21. The component of claim 1, wherein the side surfaces are longer than the end surfaces.

22. The component of claim 1, wherein the integrated photovoltaic roofing component comprises a unitary structure adapted to be applied to the roofing surface.

23. An integrated photovoltaic roofing panel for attachment to a roofing surface, comprising:
   a flexible membrane having a top surface and a bottom surface, said bottom surface for application to the roofing surface;
   a first group of photovoltaic modules, each module of the first group comprising a top surface, a bottom surface, first and second sides and front and rear ends, each module of the first group further comprising a plurality of solar cells, the plurality of modules of the first group arranged side-by-side;
   a second group of photovoltaic modules, each module of the second group comprising a top surface, a bottom surface, first and second sides and front and rear ends, each module of the second group further comprising a plurality of solar cells, the plurality of modules of the second group arranged side-by-side; and
   an electrical connection between a first group and a first module of the second group, the electrical connection comprising one of a positive lead and a negative lead extending from the first module of the first group, the other of a positive lead and a negative lead extending from the first module of the second group, and an intermodule connection lead between the positive lead and the negative lead;
   wherein said first and second groups of photovoltaic modules are attached to said top surface of said flexible membrane;
   wherein said first and second groups of photovoltaic modules are arranged end-to-end so that positive and negative leads extending from modules of said first and second groups are located in a central area encompassing adjacent ends of said modules of said first and second groups;
   wherein the entire intermodule connection lead from a location adjacent the positive lead to a location adjacent the negative lead runs along the bottom of the flexible membrane.

24. The panel of claim 23, wherein said first and second groups of modules are attached to said top surface of said flexible membrane with an adhesive.

25. The panel of claim 23, wherein said flexible membrane comprises a single-ply membrane.

26. The panel of claim 25, wherein said single-ply membrane is a thermoplastic membrane sheet, an elastomeric membrane sheet, or a reinforced bituminous membrane sheet.

27. The panel of claim 23, wherein each module includes about 22 solar cells.

28. The panel of claim 23, wherein each module of said first and second groups of modules is flexible.

29. The panel of claim 23, wherein said flexible membrane has an aperture therethrough and the electrical connection between the first module of the first group and the first module of the second group passes through the aperture.

30. The panel of claim 29, further comprising an insulative layer applied to said bottom surface of said flexible membrane that covers said aperture defined by said flexible membrane.

31. The panel of claim 23, further comprising a seal along an elongated edge between said flexible membrane and an elongated photovoltaic module.

32. The panel of claim 23, further comprising a seal along an end of said flexible membrane and an elongated photovoltaic module.

33. The panel of claim 23, wherein said flexible membrane and said first and second groups of modules attached to said flexible membrane can be rolled upon themselves.

34. The panel of claim 23, wherein said first and second groups of modules are attached to a single sheet of flexible membrane.

35. The panel of claim 23, wherein said first group of modules includes six modules arranged side-by-side, said second group of modules includes six modules arranged side-by-side, and said first and second groups of six modules are also arranged end-to-end.

36. The panel of claim 23, wherein electrical leads of said first and second groups supply power generated by each of said modules to another device.

37. The panel of claim 36, wherein:
   electrical leads at adjacent ends of said modules in said first group interconnect said modules in said first group; and
   electrical leads at adjacent ends of said modules in said second group interconnect said modules in said second group.

38. A method of transporting an integrated photovoltaic roofing component for attachment to a roofing surface, comprising:
   making an electrical connection between a first module and a second module of a plurality of photovoltaic modules of the integrated photovoltaic roofing component at a manufacturing facility, the integrated photovoltaic roofing component comprising a flexible membrane having a top surface and a bottom surface, said bottom surface for application to the roofing surface of the plurality of photovoltaic modules, each module comprising a top surface, a bottom surface, first and second sides and front and rear ends, each module further comprising a plurality of solar cells, the plurality of modules arranged side-by-side and attached to said top surface of said flexible membrane, and the electrical connection between the first module and the second module of the plurality of modules comprising one of a positive lead and a negative lead extending from the first module of the plurality of modules, the other of a positive lead and a negative lead extending from the second module of the plurality of modules, and an intermodule connection lead between the positive lead and the negative lead wherein the entire intermodule connection lead from a location adjacent the positive lead to a location adjacent the negative lead runs along the bottom surface of the flexible membrane; and after making the electrical connection at the manufacturing facility, then transporting the integrated photovoltaic roofing component to an offsite location.

* * * * *

UNITED STATES PATENT AND TRADEMARK OFFICE
CERTIFICATE OF CORRECTION

PATENT NO. : 7,342,171 B2
APPLICATION NO. : 10/351299
DATED : March 11, 2008
INVENTOR(S) : Bruce M. Khouri It is certified that error appears in the above-identified patent and that said Letters Patent is hereby corrected as shown below:

On the Title Page

(57) ABSTRACT, line 13            Delete "coverts",
                                  Insert --converts--

In the Claims

Column 12, line 42, Claim 8       Delete "wherein said",
                                  Insert --wherein--

Column 12, line 59, Claim 12      After "of",
                                  Delete "elongated"

Column 13, line 4, Claim 15       After "wherein",
                                  Delete "said"

Column 13, line 12, Claim 17      After "wherein",
                                  Delete "said"

Column 13, line 44, Claim 23      After "between a",
                                  Insert --first module of the--

Column 13, line 63, Claim 23      After "bottom",
                                  Insert --surface--

UNITED STATES PATENT AND TRADEMARK OFFICE
CERTIFICATE OF CORRECTION

PATENT NO. : 7,342,171 B2
APPLICATION NO. : 10/351299
DATED : March 11, 2008
INVENTOR(S) : Bruce M. Khouri It is certified that error appears in the above-identified patent and that said Letters Patent is hereby corrected as shown below:

Column 15, line 7, Claim 38    Delete "lead wherein",
                               Insert --lead, wherein--

Signed and Sealed this

Twenty-first Day of October, 2008

JON W. DUDAS
*Director of the United States Patent and Trademark Office*